(12) United States Patent
Uno et al.

(10) Patent No.: US 7,850,499 B2
(45) Date of Patent: Dec. 14, 2010

(54) METHOD OF MANUFACTURING ORGANIC ELECTROLUMINESCENCE DISPLAY APPARATUS

(75) Inventors: Yoshinori Uno, Tokyo (JP); Naoto Okada, Narashino (JP)

(73) Assignee: Canon Kabushiki Kaisha, Tokyo (JP)

( * ) Notice: Subject to any disclaimer, the term of this patent is extended or adjusted under 35 U.S.C. 154(b) by 189 days.

(21) Appl. No.: 12/175,079

(22) Filed: Jul. 17, 2008

(65) Prior Publication Data

US 2009/0117807 A1    May 7, 2009

(30) Foreign Application Priority Data

Jul. 25, 2007    (JP) .............................. 2007-192754

(51) Int. Cl.
*H01J 9/20*    (2006.01)
*H01J 9/42*    (2006.01)

(52) U.S. Cl. .............................................. 445/6; 445/3

(58) Field of Classification Search ...................... 445/3, 445/6

See application file for complete search history.

(56) References Cited

U.S. PATENT DOCUMENTS

| 6,626,717 B2 | 9/2003 | Miyashita et al. ............... 445/3 |
| 7,040,943 B2 * | 5/2006 | Takahashi et al. ............... 445/6 |
| 2002/0123291 A1 * | 9/2002 | Miyashita et al. ............... 445/3 |
| 2006/0115912 A1 * | 6/2006 | Masumoto ................... 438/22 |

FOREIGN PATENT DOCUMENTS

| JP | 3250561 | 11/2001 |
| JP | 3552317 | 5/2004 |

* cited by examiner

*Primary Examiner*—Bumsuk Won
*Assistant Examiner*—Nathaniel J Lee
(74) *Attorney, Agent, or Firm*—Fitzpatrick, Cella, Harper & Scinto

(57) ABSTRACT

Provided is a method of manufacturing an organic electroluminescence display apparatus including an organic electroluminescence device formed on a substrate, the organic electroluminescence device including a first electrode and a second electrode, at least one of which is transparent, and an organic emission layer formed between the first electrode and the second electrode, the organic emission layer being for emitting light by application of a current. Aging is performed until a rate of change in current efficiency of the organic electroluminescence device per unit time at a predetermined luminance or the amount of change per unit time in the rate of change in current efficiency of the organic electroluminescence device per unit time falls within a predetermined range.

8 Claims, 6 Drawing Sheets

METHOD OF MANUFACTURING ORGANIC ELECTROLUMINESCENCE DISPLAY APPARATUS

BACKGROUND OF THE INVENTION

1. Field of the Invention

The present invention relates to a method of manufacturing an organic electroluminescence (hereinafter, abbreviated as EL) display apparatus.

2. Description of the Related Art

Japanese Patent No. 3,250,561 discloses a method of manufacturing an organic EL display apparatus for performing so-called aging to suppress a change in luminance of the organic EL display apparatus with elapse of time. The aging is a treatment for applying a current between an anode and a cathode. According to the disclosed method, the aging for obtaining a curve of change in luminance with time, which is measured when an organic EL device is driven at a constant current, is first performed. Thereafter, the curve of change in luminance with time is analyzed to be divided into a component having a slowest luminance age-deterioration rate and other components. Then, the aging is conducted until a luminance becomes approximately equal to an initial value of the component having a slowest luminance age-deterioration rate.

Japanese Patent No. 3,552,317 discloses a method of manufacturing an organic EL display apparatus for aging an organic emission layer interposed between an anode and a cathode formed on a substrate at a current density 5 to 1000 times as large as a current density during the use. In addition to this method, there is also disclosed a method of manufacturing an organic EL display apparatus for aging an organic emission layer at a current density of 0.01 to 1 A/cm$^2$.

Each of the above-mentioned related art references describes the invention for performing the aging by applying a prescribed current to the organic EL device to reduce a change in luminance of the organic EL device when a predetermined current density or a predetermined voltage is applied after the aging. However, when the aging is performed at the prescribed current, the luminance during or at the end of the aging sometimes differs from the maximum luminance during the use because the luminance of the organic EL device during the aging successively changes. In this case, the appropriate aging is not sometimes performed for the following reasons.

The organic EL device tends to have a higher rate of change (|dL/dt|) in luminance (L) per unit time as the luminance becomes higher. Therefore, when the luminance during the aging is lower than the luminance during the use, the rate of change (|dL/dt|) during the use becomes higher than the rate of change at the end of aging even if the rate of change (|dL/dt|) during the aging reaches a predetermined value. Accordingly, there is fear that the upper limit of the amount of change with elapse of time at the maximum luminance, which is demanded for the use, is not achieved.

On the other hand, when the luminance during the aging is higher than the luminance during the use, |dL/dt| tends to be lower than |dL/dt| at the end of the aging even if the rate of change (|dL/dt|) during the aging reaches a predetermined value. Therefore, there is fear that the aging is performed longer than needed to exceed the upper limit of the amount of change with elapse of time at the maximum luminance, which is demanded for the use.

As described above, when the aging is performed at a constant current applied to the organic EL device, the estimation of a change in |dL/dt| due to the aging at the maximum luminance during the use sometimes becomes difficult because the luminance of the organic EL device is not constant.

The organic EL device generally has a larger change (deterioration) in luminance per unit time as the luminance (L) becomes higher. Therefore, when the luminance used for the aging differs from the luminance during the use, the luminance during the actual use is not sometimes stabilized to be a predetermined amount or less even if the change in luminance per unit time is reduced to the predetermined amount or less. Therefore, when the luminance during the aging is lower than the luminance during the actual use, the completion of the aging cannot be determined because the change in luminance per unit time during the aging is larger than the change in luminance per unit time during the actual use.

In order to avoid the above-mentioned situation, it is necessary to set a luminance value for the aging larger than the maximum value of the luminance during the actual use. However, when the aging is performed at a constant current value, the luminance of the organic EL device is varied by the aging. Therefore, it is disadvantageously difficult to estimate an optimal luminance for aging in consideration of the change in luminance due to aging.

SUMMARY OF THE INVENTION

In view of the above-mentioned problem, the present invention provides a method of manufacturing an organic EL display apparatus, which is capable of preventing aging from being performed longer than needed to exceed an upper limit of the amount of a change with elapse of time at the maximum luminance, which is demanded for the use.

According to an aspect of the present invention, there is provided a method of manufacturing an organic EL display apparatus including a first electrode and a second electrode formed on a substrate, at least one of the first and second electrodes being transparent, and an organic emission layer formed between the first electrode and the second electrode, the organic emission layer emitting light by application of a current. The organic EL device in the organic EL display apparatus is aged at a predetermined luminance. The aging is performed until a rate of change in current efficiency of the organic EL device per unit time falls within a predetermined range.

Note that the current efficiency ($\eta$) is obtained by dividing a luminance of the organic EL device in the organic EL display apparatus by a current density. The rate of change in current efficiency per unit time (|d(log $\eta$)/dt|) represents a rate of change in current efficiency after a unit time, and is obtained by <Equation 1>, where $\eta$ is a current efficiency and t is a time. In <Equation 1>, a current efficiency at a time to is denoted by $\eta_0$, and a current efficiency at a time $t_1$ after elapse of a time $t_a$ from $t_0$ is denoted by $\eta_1$. For example, when |d(log $\eta$)/dt| is obtained as $1.0 \times 10^{-3}$, it means that the current efficiency changes by 0.1% per hour.

The rate of change in current efficiency per unit time <Equation 1>:

$$\left|\frac{d(\log \eta_{(t)})}{dt}\right| = \frac{1}{\eta_{(t)}} \cdot \left|\frac{d \eta_{(t)}}{dt}\right| = \frac{1}{\eta_0} \cdot \frac{|\eta_1 - \eta_0|}{t_1 - t_0} = \frac{|\eta_1 - \eta_0|/\eta_0}{t_1 - t_0}$$

The organic EL device in the organic EL display apparatus is aged at a predetermined luminance. The aging is performed until the amount of change per unit time in rate of change in current efficiency of the organic EL device per unit time falls within a predetermined range.

Note that the current efficiency ($\eta$) is obtained by dividing a luminance of the organic EL device in the organic EL display apparatus by a current density. The amount of change per unit time of the rate of change in current efficiency per unit time ($|d^2(\log \eta)/dt^2|$) represents the amount of change of a rate of change in current efficiency after a unit time, and is obtained by <Equation 2>, where $\eta$ is the current efficiency and t is a time (hour). In <Equation 2>, a current efficiency at a time $t_0$ is denoted by $\eta_0$, a current efficiency at a time $t_1$ after elapse of a time $t_a$ from to is denoted by $\eta_1$, and a current efficiency at $t_2$ after elapse of a time $t_a$ from $t_1$ is donated by $\eta_2$.

The amount of change of the rate of change in current efficiency per unit time <Equation 2>:

$$\left|\frac{d^2(\log \eta_{(t)})}{dt^2}\right| = \left[\frac{|\eta_2 - \eta_1|/\eta_1}{t_2 - t_1} - \frac{|\eta_1 - \eta_0|/\eta_0}{t_1 - t_0}\right] / [(t_2 - t_1)/2 + (t_1 - t_0)/2]$$

The present invention can suppress the rate of change in luminance per unit time when the organic EL device in the organic EL display apparatus is driven at a predetermined current or voltage after aging to a desired value or less. Therefore, the upper limit of the amount of change with elapse of time at the maximum luminance, which is demanded for the use, is achieved. At the same time, the aging can be prevented from being performed longer than needed to exceed the upper limit of the amount of change with elapse of time at the maximum luminance, which is demanded for the use.

In particular, a manufacturing method according to another aspect of the invention can make the rate of change per unit time substantially constant. Therefore, the aging can be performed at higher accuracy.

Further features of the present invention will become apparent from the following description of exemplary embodiments with reference to the attached drawings.

DESCRIPTION OF THE EMBODIMENTS

Hereinafter, embodiments of the present invention are described referring to FIGS. 1 to 3.

Figure 1:
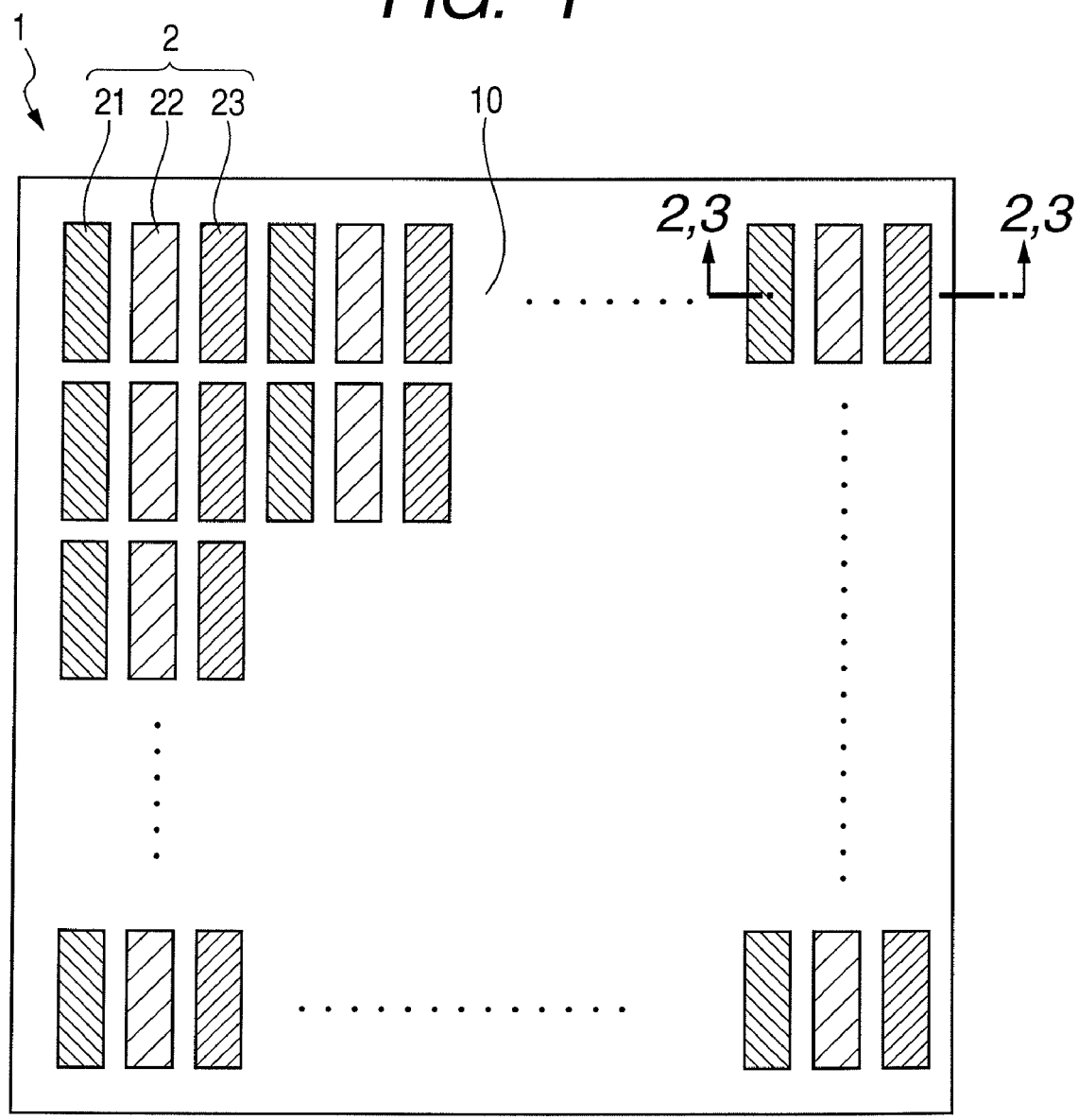
FIG. 1 is a schematic plan view illustrating an example of an organic EL display apparatus.

FIG. 1 illustrates an example of an organic EL display apparatus 1 to which the present invention can be applied. The organic EL display apparatus 1 includes a plurality of organic EL devices 2 (21, 22 and 23) arranged in a matrix on a substrate. In FIG. 1, a device boundary portion 10 is provided between the organic EL devices 2. The organic EL device 21 emits red light, the organic EL device 22 emits green light, and the organic EL device 23 emits blue light.

Figure 2:
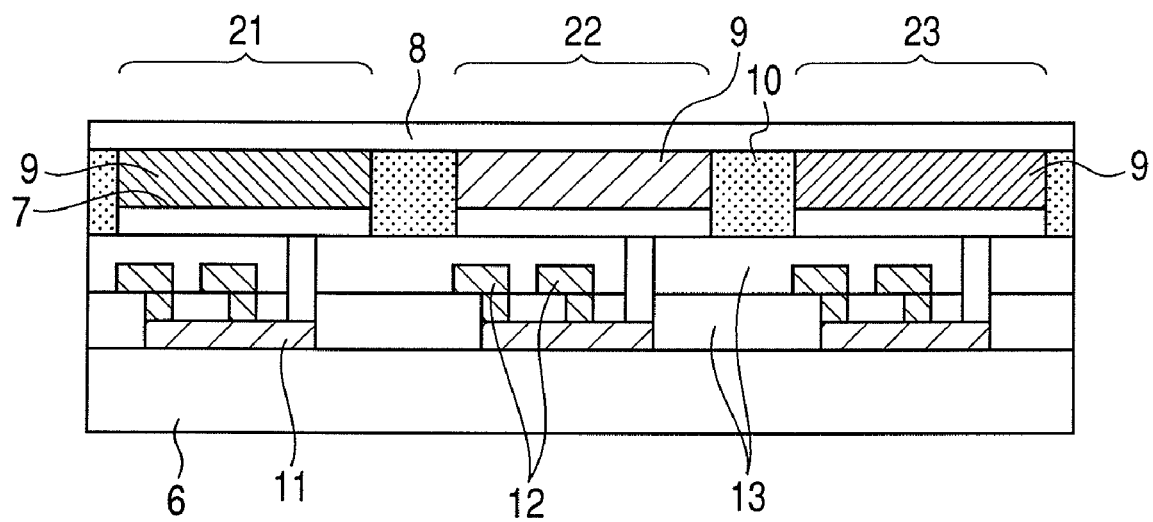
FIG. 2 is a schematic sectional view illustrating the example of the organic EL display apparatus.
Figure 3:
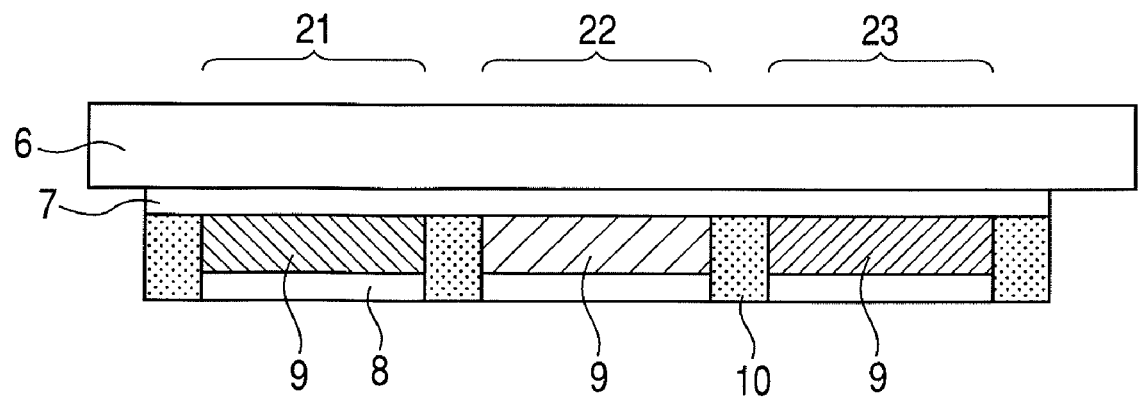
FIG. 3 is a schematic sectional view illustrating another example of the organic EL display apparatus.

In FIGS. 2 and 3 illustrating a cross-section cut along a line 2,3-2,3 in FIG. 1, the organic EL display apparatus 1 including the plurality of organic EL devices 2 formed on a substrate 6 is first manufactured. Each of the organic EL devices 2 includes a first electrode 7 and a second electrode 8, and an organic emission layer formed between the first electrode 7 and the second electrode 8. At least one of the first electrode 7 and the second electrode 8 is transparent. The organic emission layer emits light by application of a current. A shape and a material of each of the members are not particularly limited. The organic EL device 2 may have any of a top-emission structure (FIG. 2) and a bottom-emission structure (FIG. 3) as a cross-sectional structure. In FIG. 2, the organic EL display apparatus 1 also includes the device boundary portion 10, switching circuits 11, wirings 12, and insulating layers 13. In FIGS. 2 and 3, organic layers 9 are also provided.

A material of the substrate 6 is not particularly limited as long as the organic EL display apparatus 1 can be formed with the substrate 6. The substrate 6 may be made of a glass or a film made of an organic material. When the top-emission structure is used, an opaque metal plate may also be used.

Materials of the first electrode 7 and the second electrode 8 are not particularly limited as long as at least one of the first electrode 7 and the second electrode 8 is semi-transparent. As a material of the transparent electrode, for example, ITO and IZO are given as examples. When a metal is used for at least one of the electrodes, it is preferred that the electrode be made of chromium, silver, platinum, aluminum or an alloy thereof. A sealing substrate may be provided on a surface of the substrate 6 on which the organic EL devices 2 are formed to prevent moisture from intruding into the organic EL devices 2.

The organic layer 9 may be made of a known material and have a known structure as long as the organic layer 9 emits light by the application of the current. For example, the organic layer 9 may have a stacked structure including a hole injection layer, a hole transport layer, an organic emission layer, an electron transport layer, and an electron injection layer, which are successively deposited.

As a material of the hole injection layer, an alkali metal such as lithium, an alkali earth metal such as Ca, a transition metal oxide such as molybdenum oxide, lithium fluoride and lithium oxide can be given as examples.

As a material of the hole transport layer, there are given N,N'-di(naphthalene-1-yl)-N,N'-diphenyl-banzidine (NPB), 4,4',4"-tris(3-methylphenylphenylamino)triphenylamine (MTDATA), N,N'-diphenyl-N,N'-di(3-methylphenyl)-1,1'-biphenyl-4,4'-diamine (TPD), and the like.

As a material of the organic emission layer (red, green, blue), an aluminium quinoline complex (Alq3) is exemplified. Alternatively, a bis(benzoquinolite)beryllium complex (bis(10-hydroxybenzo[h]quinolinato)beryllium: Bebq$_2$) in addition to quinacridone derivatives are exemplified.

As a material of the electron transport layer, there are given an aluminium quinoline complex (Alq3), a bis(benzoquinolinolate)beryllium complex (bis(10-hydroxybenzo[h]quinolinato)beryllium: Bebq$_2$), and the like.

An organic compound, which can be used as a material of the electron injection layer, contains an electron donative dopant such as cesium carbonate, lithium carbonate and AlLi.

In particular, an organic compound containing a phenanthroline compound doped with carbonate is preferred.

The organic layer 9 is not necessarily required to include the hole injection layer, the hole transport layer, the electron transport layer, and the electron injection layer. For the formation of the organic layer 9, a manufacturing method by vapor deposition using resistive heating, a Knudsen cell or a valved cell is given as a good exemplary manufacturing method. Alternatively, a co-vapor deposition method for simultaneously vapor-depositing a dopant and an organic compound by heating may also be used.

The in-plane arrangement of the organic EL devices 2 in the organic EL display apparatus 1 is not particularly limited. A segment arrangement, a passive matrix arrangement, and an active matrix arrangement are preferred exemplary structures. A structure, in which the organic EL devices 2 of different colors are periodically arranged, is also one of the good exemplary structures. As an example of the arrangement of the organic EL devices emitting light of different colors, a structure, in which the organic EL devices respectively emitting red light, green light and blue light are periodically arranged, is given as an example.

Next, the thus manufactured organic EL display apparatus is subjected to aging.

Figure 4:
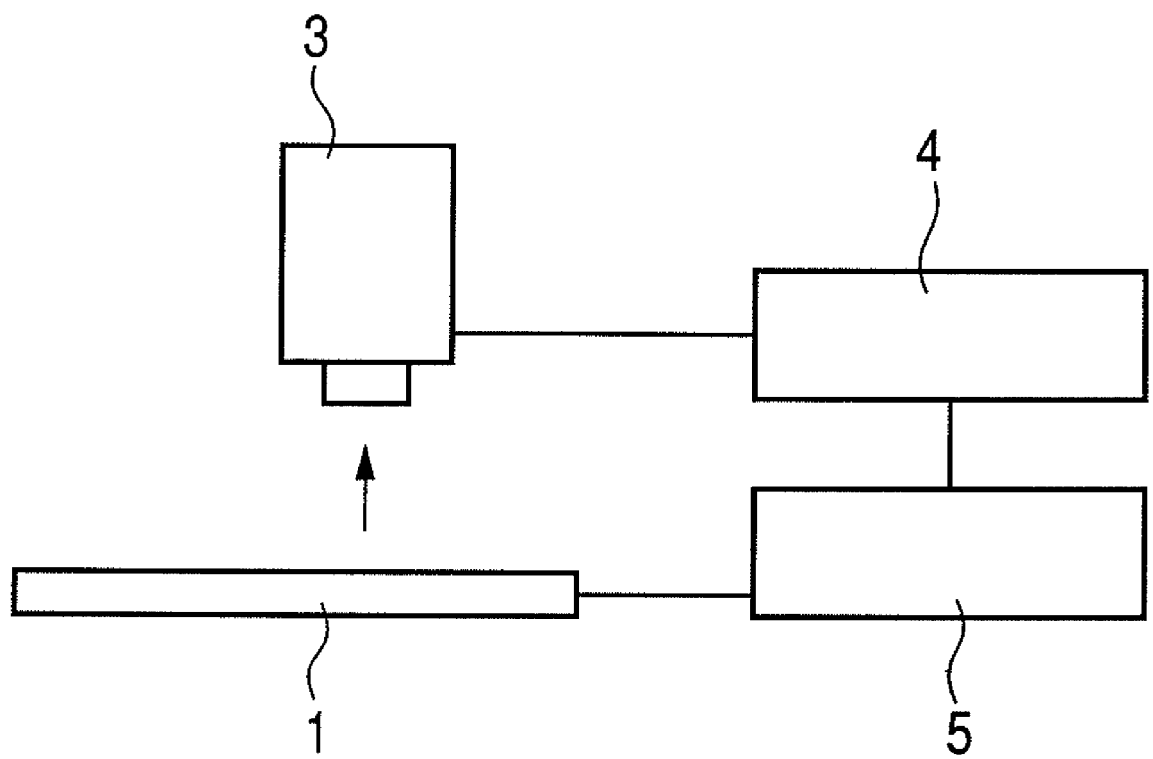
FIG. 4 is a schematic view illustrating an example of an apparatus used for an aging method according to the present invention.

First, the organic EL devices 2 in the organic EL display apparatus 1 are driven by a driver 5. A luminance during the driving is measured by a spectral calorimeter 3 (see FIG. 4). Then, based on the result of the measurement, a voltage or a current to be applied to the organic EL devices 2 in the organic EL display apparatus 1 is determined by an output computation apparatus 4. Subsequently, the determined driving condition is input to the driver 5 to age the organic EL devices 2 in the organic EL display apparatus 1 at a predetermined luminance.

Hereinafter, an aging method according to the present invention is described for each of the embodiments. In the following description, $|d(\log \eta)/dt|$ ($|d^2(\log \eta)/dt^2|$) tends to be greater in the early stage of aging and then gradually decrease in many cases. Therefore, in the following description, when the organic EL devices 2 in the organic EL display apparatus 1 are caused to emit light at a constant luminance, the current efficiency is lowered and $|d(\log \eta)/dt|$ ($|d^2(\log \eta)/dt^2|$) gradually becomes smaller as the current density increases.

Embodiment 1

In this Embodiment 1, a current is applied to the organic EL devices 2 in the organic EL display apparatus 1 to cause the organic EL devices 2 to emit light at a constant luminance. The aging is performed until $|d(\log \eta)/dt|$ at the luminance falls within a predetermined range. When the organic EL devices 2 in the organic EL display apparatus 1 are caused to emit light at a predetermined luminance, the current efficiency of the organic EL devices 2 is lowered due to an increase in current density, which is caused with the deterioration of the organic EL devices 2. The decrease in current efficiency of the organic EL devices 2 is moderated, and $|d(\log \eta)/dt|$ gradually decreases. Then, when $|d(\log \eta)/dt|$ falls within a predetermined range, the aging is terminated. As a result, a rate of change in luminance per unit time when the organic EL devices 2 in the organic EL display apparatus 1 are driven at a predetermined current or voltage after the aging can be restrained to be equal to or lower than a desired value.

Embodiment 2

In this Embodiment 2, a current is applied to the organic EL devices 2 in the organic EL display apparatus 1 to cause the organic EL devices 2 to emit light at a constant luminance. The aging is performed until $|d^2(\log \eta)/dt^2|$ at the luminance falls within a predetermined range. When the organic EL devices 2 in the organic EL display apparatus 1 are caused to emit light at a predetermined luminance, the current efficiency of the organic EL devices 2 is lowered due to an increase in current density, which is caused with the deterioration of the organic EL devices 2. The decrease in current efficiency demonstrates a tendency to be rapid at the start of decrease and then be moderated. Correspondingly, $|d^2(\log \eta)/dt^2|$ gradually decreases in the aging process. Then, when $|d^2(\log \eta)/dt^2|$ falls within a predetermined range, the aging is terminated. As a result, a rate of change in luminance per unit time when the organic EL devices 2 in the organic EL display apparatus 1 are driven at a predetermined current or voltage after the aging can be restrained to be equal to or lower than a desired value. In particular, the aging method in this Embodiment 2 allows the rate of change per unit time to be kept substantially constant.

Embodiment 3

As a variation of Embodiment 1 or 2 described above, an aging method for measuring $|d(\log \eta)/dt|$ ($|d^2(\log \eta)/dt^2|$) at predetermined time intervals is one of the preferred aging methods. In order to measure $|d(\log \eta)/dt|$ ($|d^2(\log \eta)/dt^2|$), the current efficiency is required to be measured at least twice (three times). Therefore, when a set of at least two (three) consecutive measurements is regarded as one measurement period, the aging can be performed in an arbitrary step between the measurement periods. As a result, by arbitrarily combining steps having different aging effects, the aging for allowing the rate of decrease in luminance after the aging to fall within the range of the rate of decrease in luminance, which is demanded for the use, can be performed.

Embodiment 4

As a variation of Embodiment 1 or 2, a method of performing the aging at the same luminance as the maximum luminance during the use is one of the good aging methods, although the luminance of the organic EL display apparatus 1 during the aging is not particularly limited. By using the same luminance as the maximum luminance during the use, $|dL/dt|$ at the maximum luminance after the aging can be relatively accurately estimated.

Moreover, when the correlation between $|d(\log \eta)/dt|$ ($|d^2(\log \eta)/dt^2|$) at the maximum luminance during the use and $|d(\log \eta)/dt|$ ($|d^2(\log \eta)/dt^2|$) at a luminance equal to or higher than the maximum luminance during the use is clear, the following method also provides one of the good examples. Specifically, the aging is performed at a luminance equal to or higher than the maximum luminance during the use. By performing the aging at a high luminance, a period of time required for the aging tends to be advantageously reduced.

Embodiment 5

As a variation of Embodiment 1 or 2 described above, the following method also provides one of the good examples.

Specifically, for aging the organic EL devices 2 in the organic EL display apparatus 1 at a predetermined luminance, a current or voltage to be applied to the organic EL devices 2 is controlled to keep the organic EL devices 2 at the predetermined luminance.

As a method of measuring the luminance of the organic EL devices 2, a luminance meter, a luminance calorimeter, a spectral calorimeter, a photodiode, and a CCD are given as examples. As a method of controlling the current or the voltage, a method of correcting the current or the voltage each time needed based on the result of the measurement of the luminance is given.

For example, when a predetermined luminance of the organic EL devices 2 is $L_t$, a luminance at which the organic EL devices 2 are measured is $L_p$, a current density applied to the organic EL devices 2 at the time of measurement of the luminance of the organic EL devices 2 is $\sigma_p$, a corrected current density to be applied to the organic EL device 2 is $\sigma_n$, and A is an arbitrary factor, $\sigma_n$ is obtained by the formula: $\sigma_n = A \times \sigma_p \times L_t/L_p$.

As described above, the current density may be controlled each time needed to keep the luminance of the organic EL devices 2 at a predetermined value. It is preferred that A be a real number greater than 0 and equal to or less than 1. The voltage may also be controlled in a similar manner.

Embodiment 6

As a variation of Embodiment 1 or 2 described above, the following method also provides one of the good examples.

Specifically, when the organic EL display apparatus 1 includes a plurality of the organic EL devices 2 emitting light of different colors arranged in a planar manner (FIG. 1), aging is performed at different periods of time for the organic EL devices having different colors, respectively. As an example of the organic EL display apparatus 1 including a plurality of the organic EL devices 21, 22, 23 emitting light of different colors arranged in a planar manner, an organic EL display apparatus including the organic EL devices 2 emitting red light, green light and blue light periodically arranged in a matrix in a planar manner is given as an example.

In this case, for example, only the organic EL device 21 which emits red light is caused to emit light at a predetermined luminance to be aged until $|d(\log \eta)/dt|$ ($|d^2(\log \eta)/dt^2|$) falls within a predetermined range. Thereafter, the organic EL device 22 which emits green light and then the organic EL device 23 which emits blue light are similarly aged. In this manner, a rate of decrease in luminance of the organic EL device 2 emitting light of each color after the aging falls within the range of a rate of decrease in luminance, which is demanded for the use.

Embodiment 7

As a variation of Embodiment 1 or 2 described above, the following method also provides one of the good examples.

Specifically, when the organic EL display apparatus 1 includes a plurality of the organic EL devices 2 emitting light of different colors arranged in a planar manner (FIG. 1), the organic EL devices 2 of two or more colors are simultaneously caused to emit light to be aged while keeping a total luminance and a total chromaticity of the plurality of colors constant. As an example of the organic EL display apparatus 1 including the plurality of the organic EL devices 2 emitting light of different colors arranged in a planar manner, an organic EL display apparatus including the organic EL devices 21, 22 and 23 respectively emitting red light, green light and blue light, which are periodically arranged in a matrix in a planar manner, is given as an example.

In this case, for example, the organic EL device 21 emitting red light, the organic EL device 22 emitting green light, and the organic EL device 23 emitting blue light are caused to simultaneously emit light. By setting a total color of the three colors to white and a total luminance to a predetermined luminance, the organic EL devices 21 to 23 are aged until a total value of $|d(\log \eta)/dt|$ ($d^2 (\log)/dt^2|$) for the three colors falls within a predetermined range. When the total chromaticity of the three colors changes during the aging due to a difference in $|d(\log \eta)/dt|$ ($|d^2(\log \eta)/dt^2|$) for each color, it is sufficient to control the luminance of light emission of each color to maintain a predetermined chromaticity. As a result, $|d(\log \eta)/dt|$ of the organic EL devices 2 in the organic EL display apparatus 1 after the aging advantageously falls within the range of dL/dt at the maximum luminance, which is demanded for the use.

Embodiment 8

As a variation of Embodiment 1 or 2 described above, the following method also provides one of the good examples.

Specifically, when the organic EL display apparatus 1 includes a plurality of the organic EL devices 2 emitting light of different colors arranged in a planar manner, the devices of two or more colors are caused to simultaneously emit light for aging. For the measurement of $|d(\log \eta)/dt|$ ($|d^2(\log \eta)/dt^2|$), the organic EL devices 2 are caused to emit light and are measured for each color. As an example of the organic EL display apparatus 1 including a plurality of the organic EL devices 2 emitting light of different colors arranged in a planar manner, an organic EL display apparatus including the organic EL devices 2 emitting red light, green light and blue light periodically arranged in a matrix in a planar manner is given as an example.

In this case, for example, the organic EL devices 2 emitting red light, green light, and blue light are caused to simultaneously emit light for aging. The organic EL devices 2 are caused to emit light at a predetermined luminance for each color at predetermined time intervals. In this manner, $|d(\log \eta)/dt|$ ($|d^2(\log \eta)/dt^2|$) is measured. As a result, a rate of decrease in luminance of the organic EL display apparatus 1 after the aging falls within the range of a rate of decrease in luminance, which is demanded for the use.

Note that when the organic EL display apparatus 1 includes a plurality of the organic EL devices 2 emitting different colors of light arranged in a planar manner, an area over which $|d(\log \eta)/dt|$ ($|d^2(\log \eta)/dt^2|$) is measured may be any of the entire area and a part of the area of the organic EL display apparatus 1. For example, a method of measuring $|d(\log \eta)/dt|$ ($|d^2(\log \eta)/dt^2|$) for specific ones of the organic EL devices 2 is one of the good methods.

Example 1

Figure 5:
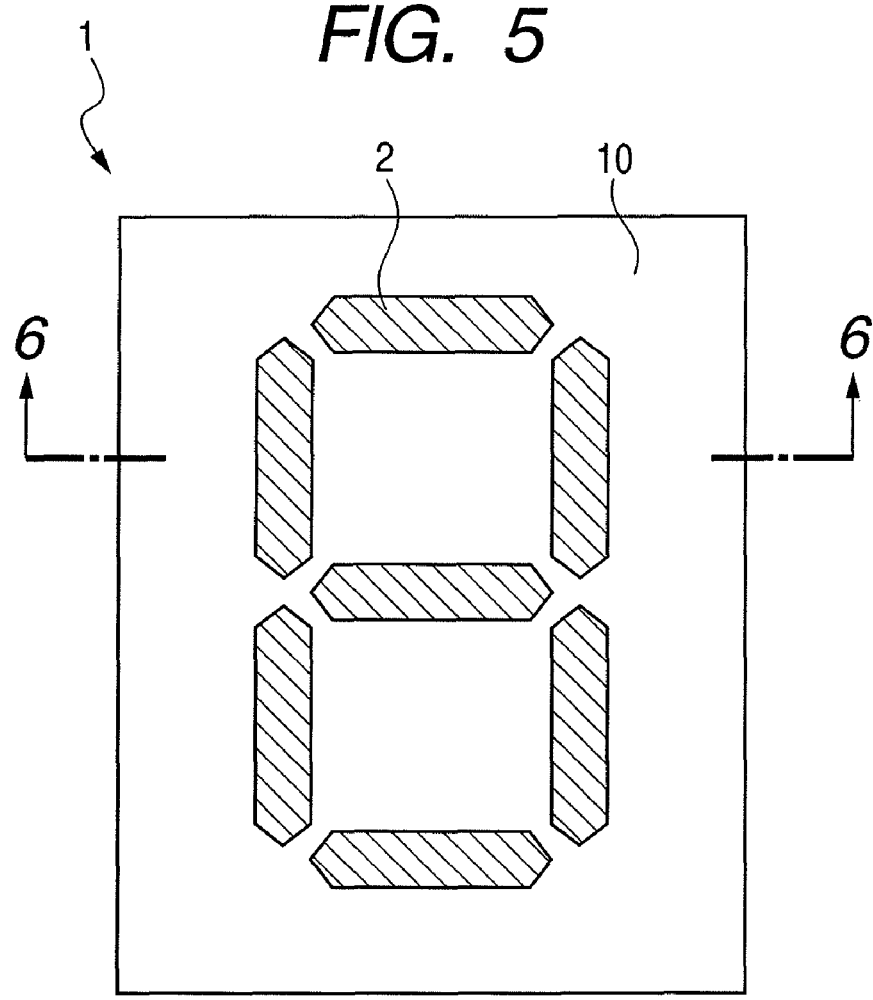
FIG. 5 is a schematic plan view illustrating the example of the organic EL display apparatus.

Hereinafter, the case where the principle of the present invention is applied to the organic EL display apparatus 1 illustrated in FIG. 5 is described.

Figure 6:
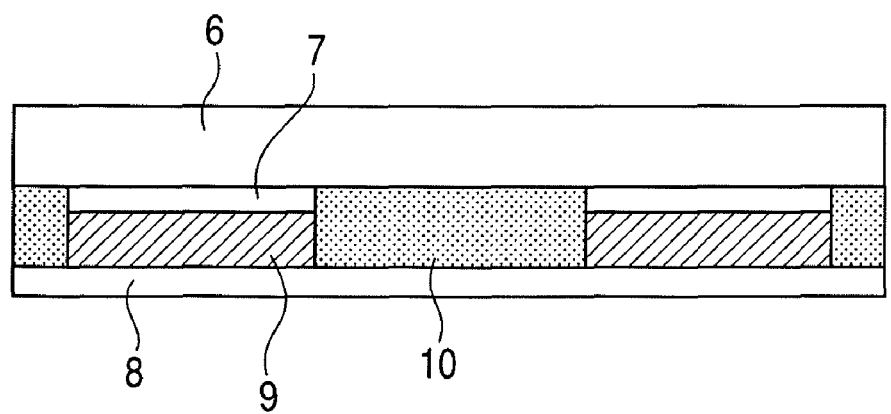
FIG. 6 is a schematic sectional view illustrating the example of the organic EL display apparatus.

FIG. 5 is a plan view of the organic EL display apparatus 1, and FIG. 6 is a sectional view cut along a line 6-6 in FIG. 5. The organic EL display apparatus 1 is a bottom-emission type display apparatus including a plurality of the organic EL devices 2 to display a fixed pattern. A glass substrate having a thickness of 0.7 mm was used as the substrate 6. The first electrode 7 was formed of ITO into a shape of an emission region of the organic EL device 2. Subsequently, the device boundary portion 10 was formed between the organic EL devices 2, and then, the organic layer 9 was formed by the above-mentioned method. Then, the second electrode 8 was formed thereon to obtain the organic EL display apparatus 1. When a voltage was applied to the organic EL display apparatus 1, the emission of green light was obtained.

The organic EL devices 2 in the organic EL display apparatus 1 were caused to simultaneously emit light at 300 cd/m², which corresponds to the maximum luminance for the use. As a result, a voltage of 3.0V and a current efficiency of 1.5 mA/cm² were required. At this time, a current efficiency was 20.0 dc/A. A luminance of the organic EL devices 2 in the organic EL display apparatus 1 was obtained by measuring a luminance of a specific one of the organic EL devices 2 with the spectral calorimeter 3. The organic EL devices 2 in the organic EL display apparatus 1 were caused to emit light at 300 cd/m² for aging.

For performing the aging for keeping the luminance, the voltage to be applied to the organic EL devices 2 was controlled based on the following method. The voltage applied to the organic EL devices 2 is V, the luminance when the voltage V is applied to the organic EL devices 2 is L, a predetermined luminance of the organic EL device 2 is $L_0$, and an arbitrary factor is A. A corrected voltage $V_n$ to be applied to the organic EL devices 2 was obtained each time needed by <Formula 1> to be applied to the organic EL devices 2.

$$V_n = A \times V \times L_0/L$$ <Formula 1> where A is an arbitrary factor as long as A is a real number larger than 0 and equal to or less than 1, and is 0.8 in this Example 1.

Figure 7:
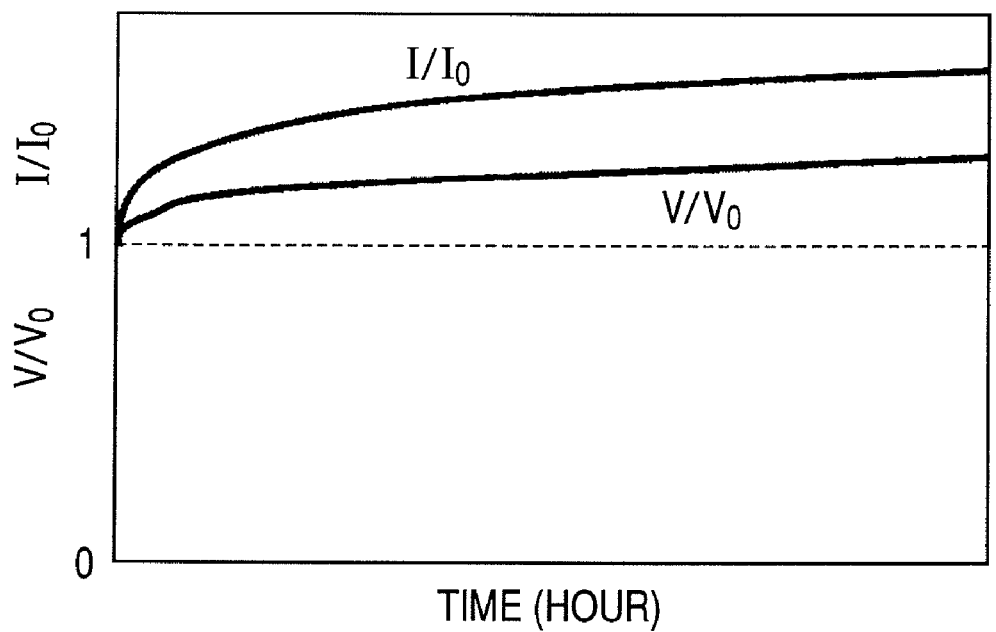
FIG. 7 is a graph illustrating a time dependency of a current relative value with respect to an initial value of the current and a voltage relative value with respect to an initial value of the voltage.
Figure 8:
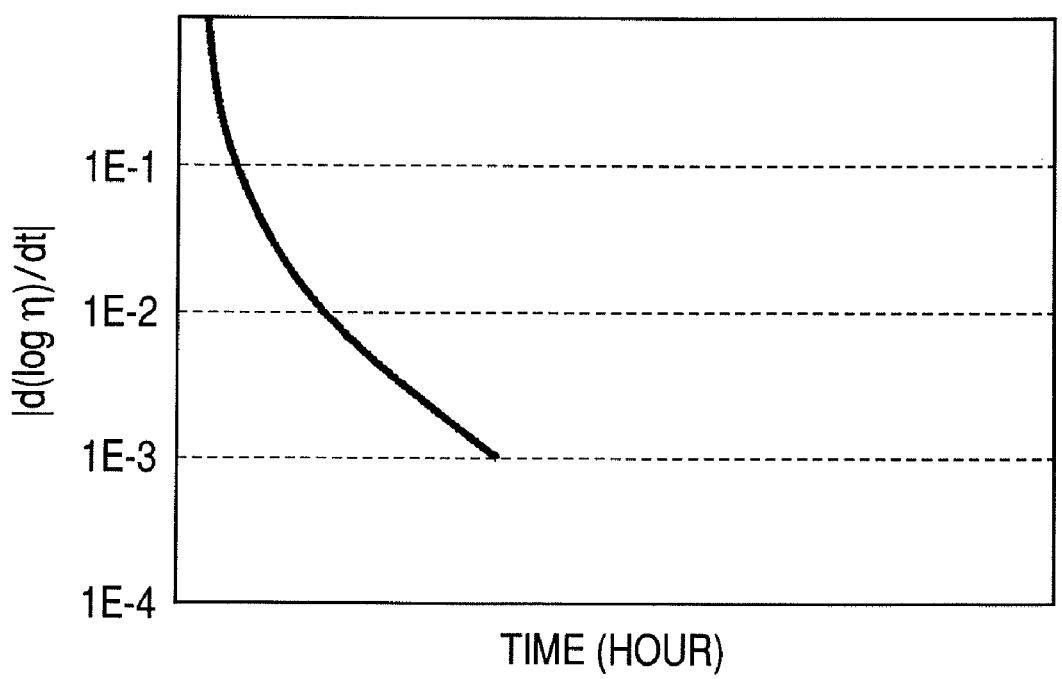
FIG. 8 is a graph illustrating $|d(\log \eta)/dt|$.

In this aging process, the time dependency of a relative value ($I/I_0$) of a current I with respect to an initial value $I_0$ of the current and the time dependency of a relative value ($V/V_0$) of a voltage V with respect to an initial value $V_0$ of the voltage are illustrated in FIG. 7. For each of the current and the voltage, the relative value with respect to the initial value exhibited an increasing behavior. From the graph in FIG. 7, $|d(\log \eta)/dt|$ was obtained (FIG. 8). In FIG. 8, an ordinate axis indicates $|d(\log \eta)/dt|$, whereas an abscissa axis indicates a time (hour). According to FIG. 8, the current efficiency exhibited the behavior of rapidly decreasing in the early stage and then exhibited the behavior of varying in a moderate manner. As a result of the continued aging as described above, $|d(\log \eta)/dt|$ was decreased to be $1.0 \times 10^{-3}$ or less. Therefore, the aging was terminated.

When the organic EL display apparatus 1 was driven at the current density of 1.65 mA/cm², the organic EL display apparatus 1 emitted light at the luminance of 300 cd/m². Then, the organic EL display apparatus 1 was continuously driven at the current density of 1.65 mA/cm². As a result, a decrease in luminance was restrained to be 0.1% or less per hour.

Example 2

Example 2 is described referring to FIGS. 1 and 3. FIG. 1 is the plan view of the organic EL display apparatus 1, and FIG. 3 is the sectional view cut along a line 2,3-2,3 in FIG. 1. The organic EL display apparatus 1 includes a plurality of the bottom-emission type organic EL devices 2 arranged in a matrix. The organic EL display apparatus 1 is a passive matrix organic EL display apparatus using the first electrodes 7 of the organic EL devices 2 in the same row as a common electrode and the second electrodes 8 of the organic EL devices 2 in the same column as a common electrode. In FIG. 3, the first electrodes 7 are arranged in a horizontal direction, whereas the second electrodes 8 are arranged in a normal direction of FIG. 3. The organic EL devices 2, which respectively emit red light, green light and blue light, are periodically arranged. The organic EL devices 2 emitting light of the same color are arranged in the same row.

A glass substrate having a thickness of 0.7 mm was used as the substrate 6. The first electrode 7 was formed of ITO into a shape of an emission region of the organic EL device 2. Next, the device boundary portion 10 was formed between the organic EL devices 2, and then, the organic layer 9 was formed by the above-mentioned method. Then, the second electrode 8 was formed of Al thereon. A sealing substrate was bonded onto a surface of the substrate 6 on which the organic EL devices 2 were formed to cover the organic EL devices 2, thereby obtaining a hermetic structure. Each of the organic EL devices 2 had dimensions of: 1 mm by 3 mm, and a set of the red device, the green device, and the blue device formed one pixel having dimensions of: 3 mm by 3 mm. The pixels were arranged in dimensions of 20 by 20 to obtain the organic EL display apparatus 1. An area of the device boundary portion 10 occupied 50% of a display area of the organic EL display apparatus 1.

The organic EL device 21 emitting red light was caused to emit light at 360 cd/m², the organic EL device 22 emitting green light was caused to emit light at 1200 cd/m², and the organic EL device 23 emitting blue light was caused to emit light at 120 cd/m². As a result, the emission of white light at 250 cd/m² was obtained. For obtaining the light emission, as a driving method, all the first electrodes 7 were connected to a GND. Signals were input to the switching circuits to apply 3.6 mA/cm² to the second electrode 8 of the organic EL device 21 emitting red light and 6.0 mA/cm² to the second electrode 8 of the organic EL device 22 emitting green light. Furthermore, a signal was input to the switching circuit to apply 6.0 mA/cm² to the second electrode 8 of the organic EL device 23 emitting blue light. The current efficiency was 10 cd/A for the organic EL device 21 emitting red light, 20 cd/A for the organic EL device 22 emitting green light, and 2 cd/A for the organic EL device 23 emitting blue light. The luminance of the organic EL display apparatus 1 was measured and obtained by the spectral calorimeter 3.

For the organic EL display apparatus 1, $|d(\log \eta)/dt|$ of the organic EL device 2 was measured for each color at predetermined time intervals. In a period in which $|d(\log \eta)/dt|$ was not measured, the organic EL device 2 of each color was aged at a prescribed current value to be applied thereto.

First, in the period in which $|d(\log \eta)/dt|$ was not measured, a current of 100 mA/cm² was applied to all the organic EL devices 2 for ten minutes. Subsequently, the organic EL device 2 of each color was caused to emit light for one minute to measure $|d(\log \eta)/dt|$. The period in which $|d(\log \eta)/dt|$ was not measured and the period in which $|d(\log \eta)/dt|$ was measured were alternated to perform aging. In this Example 2, this process was repeated until $1 \times 10^{-3}$ of each color was obtained as $|d(\log \eta)/dt|$.

A method of performing the aging in the period, in which $|d(\log \eta)/dt|$ is measured, is described. First, the organic EL device 21 emitting red light was caused to emit light at 360 cd/m² for one minute. From a change in current efficiency between the start and the end of the light emission, $|d(\log \eta)/dt|$ was obtained. Subsequently, the organic EL device 22 emitting green light was caused to emit light at 1200 cd/m² for one minute in a similar manner. From a change in current efficiency between the start and the end of the light emission, $|d(\log \eta)/dt|$ was obtained. Similarly, the organic EL device 23 emitting blue light was caused to emit light at 120 cd/m² for one minute. From a change in current efficiency between the start and the end of the light emission, |d(log η)/dt| was obtained. The reason why the organic EL devices 2 respectively emitting red light, green light and blue light were caused to emit light respectively at 360 cd/m², 1200 cd/m², and 120 cd/m² is because the simultaneous emission of light of the respective colors corresponds to white light emission at the luminance of 250 cd/m², which is the maximum luminance during the use. For performing the aging for maintaining the luminance, the density of the current to be applied to the organic EL devices 2 was controlled based on the following method.

In the period in which |d(log η)/dt| was measured, the density of the current to be applied to each of the organic EL devices 2 was controlled to maintain the luminance of the organic EL device 2 of each color. The organic EL device 21 emitting red light was caused to emit light at 180 cd/m², the organic EL device 22 emitting green light was caused to emit light at 600 cd/m², and the organic EL device 23 emitting blue light was caused to emit light at 60 cd/m². At the above-mentioned luminance, the light emission of each color was maintained. The luminances of the respective colors are denoted by $L_{r0}$, $L_{go}$, and $L_{bo}$, the measured values of the respective luminances are denoted by $L_r$, $L_g$, and $L_b$, and the current densities at the time of measurement of the current efficiencies of the respective organic EL devices 2 are denoted by $I_r$, $I_g$, and $I_b$. The density of the current to be applied to each of the organic EL devices 2 was obtained by <Formula 2>, and was corrected each time needed. In <Formula 2>, the corrected current densities to be applied to the respective organic EL devices 2 are $I_{rn}$, $I_{gn}$, and $I_{bn}$.

$$I_{rn}=A\times I_r\times L_{r0}/L_r,\ I_{gn}=A\times I_g\times L_{g0}/L_g,\ I_{bn}=A\times I_b\times L_{b0}/L_b \quad <\text{Formula 2}>$$

By the above-mentioned procedure, the current was applied to each of the organic EL devices 2 to control the luminance to a predetermined value. In this aging process, the relative value (I/I₀) of the current I with respect to the initial value $I_0$ of the current and the relative value (V/V₀) of the voltage V with respect to the initial value $V_0$ of the voltage exhibited the same behaviors as those in Example 1.

In the organic EL display apparatus 1, the organic EL device 21 emitting red light was driven at 3.96 mA/cm², the organic EL device 22 emitting green light was driven at 6.6 mA/cm², and the organic EL device 23 emitting blue light was driven at 6.6 mA/cm². As a result, the organic EL display apparatus 1 emitted light at the luminance of 250 cd/m². Moreover, when the organic EL devices 2 were continuously driven while maintaining the current densities, a decrease in luminance was restrained to be 0.1% or less per hour.

Example 3

Example 3 is described referring to FIGS. 1 and 2. FIG. 1 is the plan view of the organic EL display apparatus 1, and FIG. 2 is a partial sectional view of the organic EL display apparatus 1. The organic EL display apparatus 1 in this Example 3 includes a plurality of the top emission type organic EL devices 2 arranged in a matrix on the substrate 6 on which the switching circuits 11 are arranged in a matrix. The first electrode 7 of the organic EL device 2 is connected to the switching circuit 11. The second electrodes 8 of all the organic EL devices 2 are integrally formed. The switching circuit 11 includes a plurality of TFT devices. The switching circuits 11 feed desired electric power to the organic EL devices 2 based on a signal from the wirings 12. In the organic EL display apparatus 1, the organic EL device 21 emitting red light, the organic EL device 22 emitting green light, and the organic EL device 23 emitting blue light are periodically arranged.

A glass substrate having a thickness of 0.7 mm was used as the substrate 6. The switching circuits 11 and the wirings 12 were made by a known method. The insulating layers 13 were provided on the switching circuits 11 and the wirings 12 thereof. Subsequently, the first electrode 7 was formed of ITO into a shape of a emission region of each of the organic EL devices 21, 22 and 23 respectively emitting red light, green light and blue light. Next, the device boundary portion 10 was formed between the organic EL devices 21, 22 and 23. Then, the organic layer 9 was formed by the above-mentioned method. Then, the second electrode 8 was formed of ITO thereon. A sealing substrate was bonded onto a surface of the substrate 6 on which the organic EL devices 2 were formed to cover the organic EL devices 2, thereby obtaining a hermetic structure. Each of the organic EL devices 21, 22 and 23 respectively emitting red light, green light and blue light, which included the device boundary portion 10, had dimensions of 0.1 mm by 0.3 mm. A set of the red device, the green device and the blue device formed one pixel having dimensions of 0.3 mm by 0.3 mm. The pixels were arranged in dimensions of 200 by 200 to obtain the organic EL display apparatus 1. An area of the device boundary portions 10 occupied 50% of a display area of the organic EL display apparatus 1.

In the organic EL display apparatus 1, a region where the organic layer of the organic EL device 21 for emitting red light was provided was caused to emit light at 360 cd/m², a region of the organic EL device 22 for emitting green light was caused to emit light at 1200 cd/m², and a region of the organic EL device 23 for emitting blue light was caused to emit light at 120 cd/m². As a result, the emission of white light at 250 cd/m² was obtained. A chromaticity of the organic EL display apparatus 1 based on the CIE in this case was: x=0.313 and y=0.329. As a driving method, all the second electrodes 8 were connected to a GND. Signals were input to the switching circuits 11 to apply 3.6 mA/cm² to the first electrode 7 of the organic EL device 21 emitting red light and 6.0 mA/cm² to the first electrode 7 of the organic EL device 22 emitting green light. A signal was also input to the switching circuit 11 to apply 6.0 mA/cm² to the first electrode 7 of the organic EL device 23 emitting blue light. The current efficiency was 10 cd/A for the organic EL device 21 emitting red light, 20 cd/A for the organic EL device 22 emitting green light, and 2 cd/A for the organic EL device 23 emitting blue light. The same plurality number of the organic EL devices 21 emitting red light, the organic EL devices 22 emitting blue light, and the organic EL devices 23 emitting green light 23 in the organic EL display apparatus 1 were measured by the spectral calorimeter 3, respectively, to obtain the luminance of the organic EL display apparatus 1. In the aging described below, the luminance of the organic EL display apparatus 1 was also measured by the same method.

The organic EL display apparatus 1 was caused to emit light at the luminance of 250 cd/m² with the CIE chromaticity of: x=0.313 and y=0.329. Then, |d(log η)/dt| of the organic EL device 2 in the organic EL display apparatus 1 was measured at constant time intervals to perform the aging.

In order to cause the organic EL display apparatus 1 to emit white light at the luminance of 250 cd/m² with the CIE chromaticity of: x=0.313 and y=0.329, the organic EL device 2 of each color was caused to emit light in the following manner. Specifically, the organic EL device 21 emitting red light was caused to emit light at 360 cd/m², the organic EL device 22 emitting green light was caused to emit light at 1200 cd/m², and the organic EL device 23 emitting blue light was caused to emit light at 120 cd/m². At this time, the current density was 3.6 for the organic EL device 21 emitting red light, 6.0 for the organic EL device 22 emitting green light, and 6.0 for the organic EL device 23 emitting blue light. Since the areas of the organic EL devices 21, 22, and 23 respectively emitting red light, green light, and blue light were the same and the area of the device boundary portion 10 occupies a half of the area of the organic EL display apparatus 1, the current efficiency of the organic EL devices 2 in the organic EL display apparatus 1 was 9.6 cd/A.

While the organic EL display apparatus 1 was caused to emit light at the luminance of 250 cd/m² with the CIE chromaticity of: x=0.313 and y=0.329, the luminance and the chromaticity of the organic EL display apparatus 1 were measured at constant time intervals to obtain |d(log η)/dt|. During the aging, the current values respectively applied to the organic EL devices 21, 22, and 23 respectively emitting red light, green light, and blue light were regulated to maintain the luminance and the CIE chromaticity of the organic EL display apparatus 1. For maintaining the luminance and the chromaticity, the current value to be applied to each of the organic EL devices 2 was determined based on the following <Formula 3>. Since the CIE chromaticity of each of the organic EL devices 21, 22, and 23 respectively emitting red light, green light, and blue light does not significantly change during the aging, the CIE chromaticity was set to a constant value to obtain |d(log η)/dt|.

$$I_{rn} = A \times I_{rp} \times L_{rt}/L_{rp}, \; I_{gn} = A \times I_{gp} \times L_{gt}/L_{gp}, \; I_{bn} = A \times I_{bp} \times L_{bt}/L_{bp}$$ <Formula 3>

$L_{rt}$, $L_{rp}$, $L_{gt}$, $L_{gp}$, $L_{bt}$, and $L_{bp}$ in above <Formula 3> are obtained by the following Equation 3.

$$\begin{pmatrix} L_{rt} \\ L_{gt} \\ L_{bt} \end{pmatrix} = \begin{pmatrix} x_r/y_r & x_g/y_g & x_b/y_b \\ 1 & 1 & 1 \\ (1-x_r-y_r)/y_r & (1-x_g-y_g)/y_g & (1-x_b-y_b)/y_b \end{pmatrix}^{-1} \begin{pmatrix} L_{wt} \cdot x_{wt}/y_{wt} \\ L_{wt} \\ L_{wt} \cdot (1-x_{wt}-y_{wt})/y_{wt} \end{pmatrix}$$

$$\begin{pmatrix} L_{rp} \\ L_{gp} \\ L_{bp} \end{pmatrix} = \begin{pmatrix} x_r/y_r & x_g/y_g & x_b/y_b \\ 1 & 1 & 1 \\ (1-x_r-y_r)/y_r & (1-x_g-y_g)/y_g & (1-x_b-y_b)/y_b \end{pmatrix}^{-1} \begin{pmatrix} L_{wp} \cdot x_{wp}/y_{wp} \\ L_{wp} \\ L_{wp} \cdot (1-x_{wp}-y_{wp})/y_{wp} \end{pmatrix}$$

where $L_{wt}$, $x_{wt}$, and $y_{wt}$ are the luminance and the CIE chromaticity coordinates of the organic EL display apparatus, which are to be maintained during the aging;

$L_{wp}$, $x_{wp}$, and $y_{wp}$ are the luminance and the CIE chromaticity coordinates of the organic EL display apparatus, which are measured during the aging;

$x_r$ and $y_r$ are the CIE chromaticity coordinates of the organic EL device emitting red light;

$x_g$ and $y_g$ are the CIE chromaticity coordinates of the organic EL device emitting green light;

$x_b$ and $y_b$ are the CIE chromaticity coordinates of the organic EL device emitting blue light;

$L_{rt}$, $L_{gt}$, and $L_{bt}$ are the luminances of the organic EL devices respectively emitting red light, green light, and blue light, which are to be maintained during the aging;

$L_{rp}$, $L_{gp}$, and $L_{bp}$ are the luminances of the organic EL devices respectively emitting red light, green light, and blue light during the aging;

$I_{rp}$, $I_{gp}$, and $I_{bp}$ are the current values respectively applied to the organic EL devices respectively emitting red light, green light, and blue light when the luminance and the CIE chromaticity coordinates of the organic EL display apparatus are measured;

$I_{rn}$, $I_{gn}$, and $I_{bn}$ are the corrected current values to be respectively applied to the organic EL devices emitting red light, green light, and blue light; and A is an arbitrary factor (A is a real number larger than 0 and equal to or less than 1; 0.8 in this Example 3).

In this Example 3, the above-mentioned process was repeated until |d(log η)/dt| of the organic EL devices 2 in the organic EL display apparatus 1 became $1 \times 10^{-3}$. In this aging process, the relative value ($I/I_0$) of the current I with respect to the initial value $I_0$ of the current and the relative value ($V/V_0$) of the voltage V with respect to the initial value $V_0$ of the voltage exhibited the same behaviors as those in Example 1.

In the organic EL display apparatus 1, the organic EL device 21 emitting red light was driven at 3.96 mA/cm², the organic EL device 22 emitting green light was driven at 6.6 mA/cm², and the organic EL device 23 emitting blue light was driven at 6.6 mA/cm². As a result, the organic EL display apparatus 1 emitted light at the luminance of 250 cd/m².

Moreover, when the organic EL devices 2 were continuously driven while maintaining the current densities, a decrease in luminance was restrained to be 0.1% or less per hour.

Example 4

Since Example 4 is substantially the same as Example 1 described above, only differences from Example 1 are described.

Figure 9:
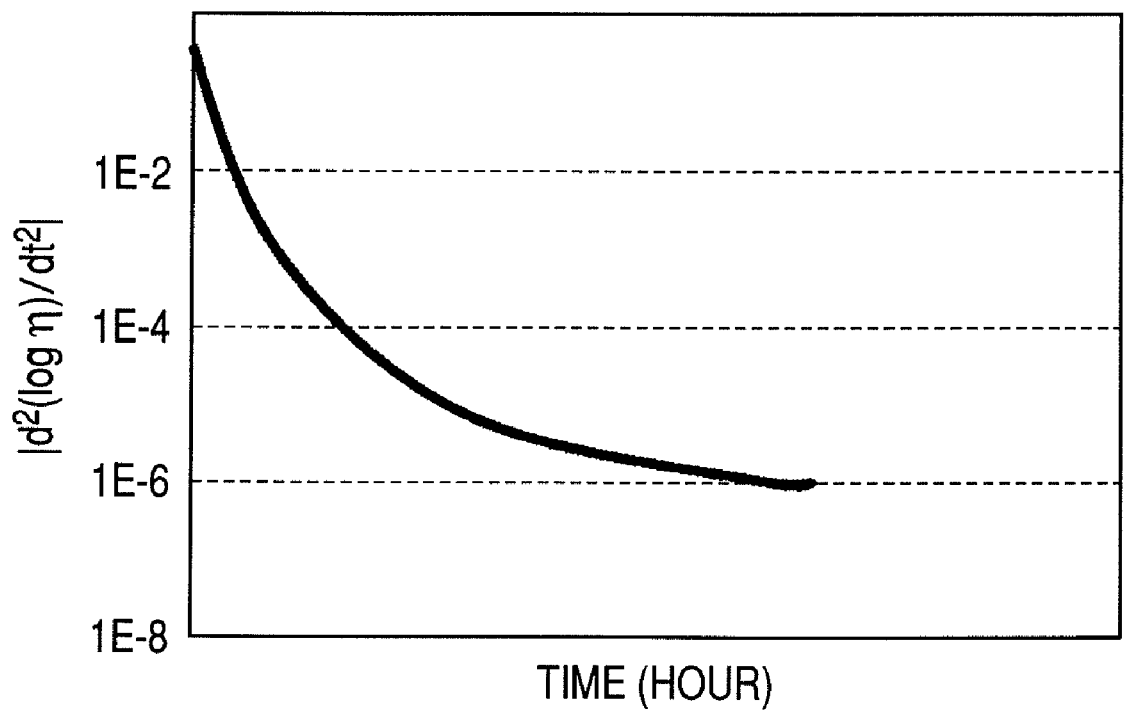
FIG. 9 is a graph illustrating $|d^2(\log \eta)/dt^2|$.

In the aging process, the time dependency of a relative value ($I/I_0$) of a current I with respect to an initial value $I_0$ of the current and that of a relative value ($V/V_0$) of a voltage V with respect to an initial value $V_0$ of the voltage are illustrated in FIG. 7. For each of the current and the voltage, the relative value with respect to the initial value exhibited an increasing behavior. From the graph illustrated in FIG. 7, $|d(\log \eta)/dt|$ was obtained (FIG. 8), and $|d^2(\log \eta)/dt^2|$ was also obtained (FIG. 9). In FIG. 8, an ordinate axis indicates $|d(\log \eta)/dt|$, whereas an abscissa axis indicates a time (hour). In FIG. 9, an ordinate axis indicates $|d^2(\log \eta)/dt^2|$, whereas an abscissa axis indicates a time (hour). According to FIGS. 8 and 9, the current efficient exhibited the behavior of rapidly decreasing in the early stage and then varying in a moderate manner. As a result of the continued aging as described above, $|d^2(\log \eta)/dt^2|$ was decreased to be $1.0 \times 10^{-6}$ or less. Therefore, the aging was terminated. At this time, $|d(\log \eta)/dt|$ was $1.0 \times 10^{-3}$.

When the organic EL display apparatus 1 was driven at the current density of 1.65 mA/cm$^2$, the organic EL display apparatus 1 emitted light at the luminance of 300 cd/m$^2$. Then, the organic EL display apparatus 1 was continuously driven at the current density of 1.65 mA/cm$^2$. As a result, a decrease in luminance was substantially kept to be about 0.1% per hour.

Example 5

Since Example 5 is substantially the same as Example 2 described above, only differences from Example 2 are described.

For the organic EL display apparatus 1, $|d^2(\log \eta)/dt^2|$ of the organic EL device 2 was measured for each color at predetermined time intervals. In a period in which $|d^2(\log)/dt^2|$ was not measured, the current value to be applied to the organic EL device 2 was prescribed for each color to perform the aging.

In Example 2 described above, the organic EL devices 2 of each color were caused to emit light for one minute. From a change in current efficiency between the start and the end of the light emission, $|d(\log \eta)/dt|$ was obtained. In this Example 5, the organic EL devices of each color were caused to emit light for one minute. In the period of the light emission, the current efficiency was measured three times. From a change in current efficiency between the measurements, $|d^2(\log \eta)/dt^2|$ was obtained.

In the organic EL display apparatus 1, the organic EL device emitting red light was driven at 3.96 mA/cm$^2$, the organic EL device emitting green light was driven at 6.6 mA/cm$^2$, and the organic EL device emitting blue light was driven at 6.6 mA/cm$^2$. As a result, the organic EL display apparatus 1 emitted light at the luminance of 250 cd/m$^2$. Moreover, when the organic EL devices 2 were continuously driven while maintaining the current densities, a decrease in luminance was substantially kept to be about 0.1% per hour.

Example 6

Since Example 6 is substantially the same as Example 3 described above, only differences from Example 3 are described.

The organic EL display apparatus 1 was caused to emit light at the luminance of 250 cd/m$^2$ with the CIE chromaticity of: x=0.313 and y=0.329. Then, $|d^2(\log \eta)/dt^2|$ of the organic EL device 2 in the organic EL display apparatus 1 was measured at constant time intervals to perform the aging.

In the organic EL display apparatus 1, the organic EL device emitting red light was driven at 3.96 mA/cm$^2$, the organic EL device emitting green light was driven at 6.6 mA/cm$^2$, and the organic EL device emitting blue light was driven at 6.6 mA/cm$^2$. As a result, the organic EL display apparatus 1 emitted light at the luminance of 250 cd/m$^2$. Moreover, when the organic EL devices 2 were continuously driven while maintaining the current densities, a decrease in luminance was substantially kept to be about 0.1% per hour.

The organic EL display apparatus manufactured by the manufacturing method of the present invention is used for monitors of a television, a portable information terminal, a cellular phone, a digital camera, a digital video camera, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-192754, filed Jul. 25, 2007, which is hereby incorporated by reference herein in its entirety.

What is claimed is:

1. A method of manufacturing an organic electroluminescence display apparatus comprising an organic electroluminescence device formed on a substrate, the organic electroluminescence device including: a first electrode and a second electrode, and an organic emission layer formed between the first electrode and the second electrode, for emitting light by application of a current, the method comprising:
   a step of aging the organic electroluminescence device; and
   a step of terminating the aging when the amount of change per unit time in rate of change in current efficiency of the organic electroluminescence device per unit time at the same luminance as the maximum luminance during use falls within a predetermined range.

2. The method of manufacturing the organic electroluminescence display apparatus according to claim 1, wherein the step of aging comprises measuring at predetermined time intervals, the rate of change in current efficiency of the organic electroluminescence device per unit time at a predetermined luminance.

3. The method of manufacturing the organic electroluminescence display apparatus according to claim 1, wherein the step of aging has a period in which the rate of change in current efficiency of the organic electroluminescence device per unit time is measured and a period in which the rate of change in current efficiency of the organic electroluminescence device per unit time is not measured, and
   a luminance of the organic electroluminescence device in the period in which the rate of change is measured is the same as the maximum luminance during use and a luminance of the organic electroluminescence device in the period in which the rate of change is not measured is a luminance equal to or higher than the maximum luminance during use.

4. The method of manufacturing the organic electroluminescence display apparatus according to claim 1, wherein the step of aging comprises regulating a current to be applied to the organic electroluminescence device at predetermined time intervals to maintain a luminance of the organic electroluminescence device during the aging to a predetermined value.

5. The method of manufacturing the organic electroluminescence display apparatus according to claim 1, wherein the step of aging comprises regulating a voltage to be applied to the organic electroluminescence device at predetermined time intervals to maintain a luminance of the organic electroluminescence device during the aging to a predetermined value.

6. The method of manufacturing the organic electroluminescence display apparatus according to claim 1, wherein:
   the organic electroluminescence display apparatus comprises a plurality of the organic electroluminescence devices respectively emitting different colors of light arranged in a planar manner; and the step of aging comprises:

causing the organic electroluminescence devices to emit light in a different period of time for each color;

measuring, for each color, the rate of change in current efficiency of the organic electroluminescence device per unit time at the same luminance as the maximum luminance during use; and terminating the aging for each color based on the rate of change.

7. The method of manufacturing the organic electroluminescence display apparatus according to claim 1, wherein:

the organic electroluminescence display apparatus includes a plurality of the organic electroluminescence devices respectively emitting different colors of light arranged in a planar manner; and the step of aging comprises:

causing the organic electroluminescence devices respectively emitting the different colors of light to simultaneously emit light to cause the organic electroluminescence display apparatus to emit light at the same luminance as the maximum luminance during use; and measuring the rate of change in current efficiency of the organic electroluminescence devices simultaneously emitted.

8. The method of manufacturing the organic electroluminescence display apparatus according to claim 1, wherein:

the organic electroluminescence display apparatus includes a plurality of the organic electroluminescence devices respectively emitting different colors of light arranged in a planar manner; and the step of aging comprises measuring, for each color, the rate of change in current efficiency of a part of the organic electroluminescence devices in the organic electroluminescence display apparatus per unit time at the same luminance as the maximum luminance during use.

* * * * *